(12) United States Patent
Matsui

(10) Patent No.: US 6,917,546 B2
(45) Date of Patent: Jul. 12, 2005

(54) MEMORY DEVICE AND MEMORY SYSTEM

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/227,647

(22) Filed: Aug. 23, 2002

(65) Prior Publication Data

US 2003/0039151 A1 Feb. 27, 2003

(30) Foreign Application Priority Data

Aug. 24, 2001 (JP) ........................................ 2001-254780

(51) Int. Cl.$^7$ ................................................ G11C 7/00
(52) U.S. Cl. ......................... 365/198; 365/63; 326/21; 326/30; 710/100
(58) Field of Search ............................ 326/21, 30, 68, 326/86; 365/189.01, 198, 63; 710/100

(56) References Cited

U.S. PATENT DOCUMENTS

| | | | |
|---|---|---|---|
| 5,467,455 A | * 11/1995 | Gay et al. | ................... 710/100 |
| 5,729,152 A | 3/1998 | Leung et al. | |
| 6,356,106 B1 | * 3/2002 | Greeff et al. | ................. 326/30 |
| 6,538,951 B1 | * 3/2003 | Janzen et al. | .......... 365/230.03 |
| 2003/0099138 A1 | * 5/2003 | Kyung | ....................... 365/200 |
| 2003/0126338 A1 | * 7/2003 | Dodd et al. | .................. 710/305 |

FOREIGN PATENT DOCUMENTS

| | | |
|---|---|---|
| JP | 06-104725 | 4/1994 |
| JP | 07-074606 | 3/1995 |
| JP | 07-135513 | 5/1995 |
| JP | 07-182078 | 7/1995 |
| JP | 10-020974 | 1/1998 |
| JP | 10-268992 | 10/1998 |
| JP | 11-066842 | 3/1999 |
| JP | 2002-033774 | 1/2002 |
| JP | 2002-082744 | 3/2002 |
| JP | 2002-230963 | 8/2002 |

OTHER PUBLICATIONS

Korean Office Action with Translation dated Sep. 21, 2004.
Japanese Office Action, Jun. 16, 2004.

* cited by examiner

Primary Examiner—Son Mai
(74) Attorney, Agent, or Firm—Katten Muchin Rosenman LLP

(57) ABSTRACT

In a memory device which is used with the memory device connected to a data bus, the memory device includes an active termination circuit for terminating the memory device when the active termination circuit is electrically put into an active state and for unterminating the memory device when the active termination circuit is electrically put into an inactive state. The memory device further includes a control circuit for controlling the active termination circuit to electrically put the active termination circuit into the active state or the inactive state.

17 Claims, 13 Drawing Sheets

FIG.3 TERMINATION CONTROL UPON READ OPERATION OF DRAM1

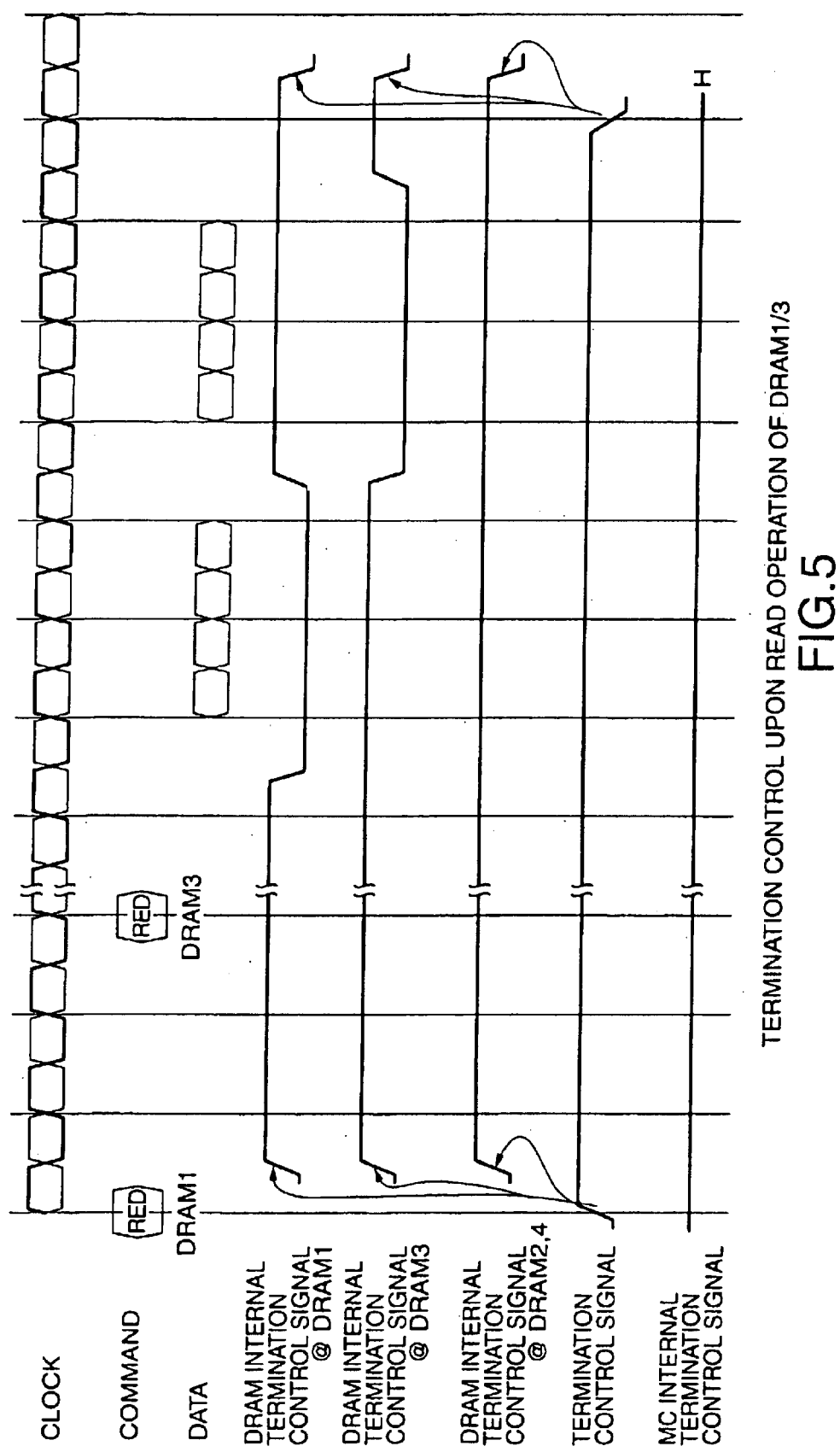
FIG.5 TERMINATION CONTROL UPON READ OPERATION OF DRAM1/3

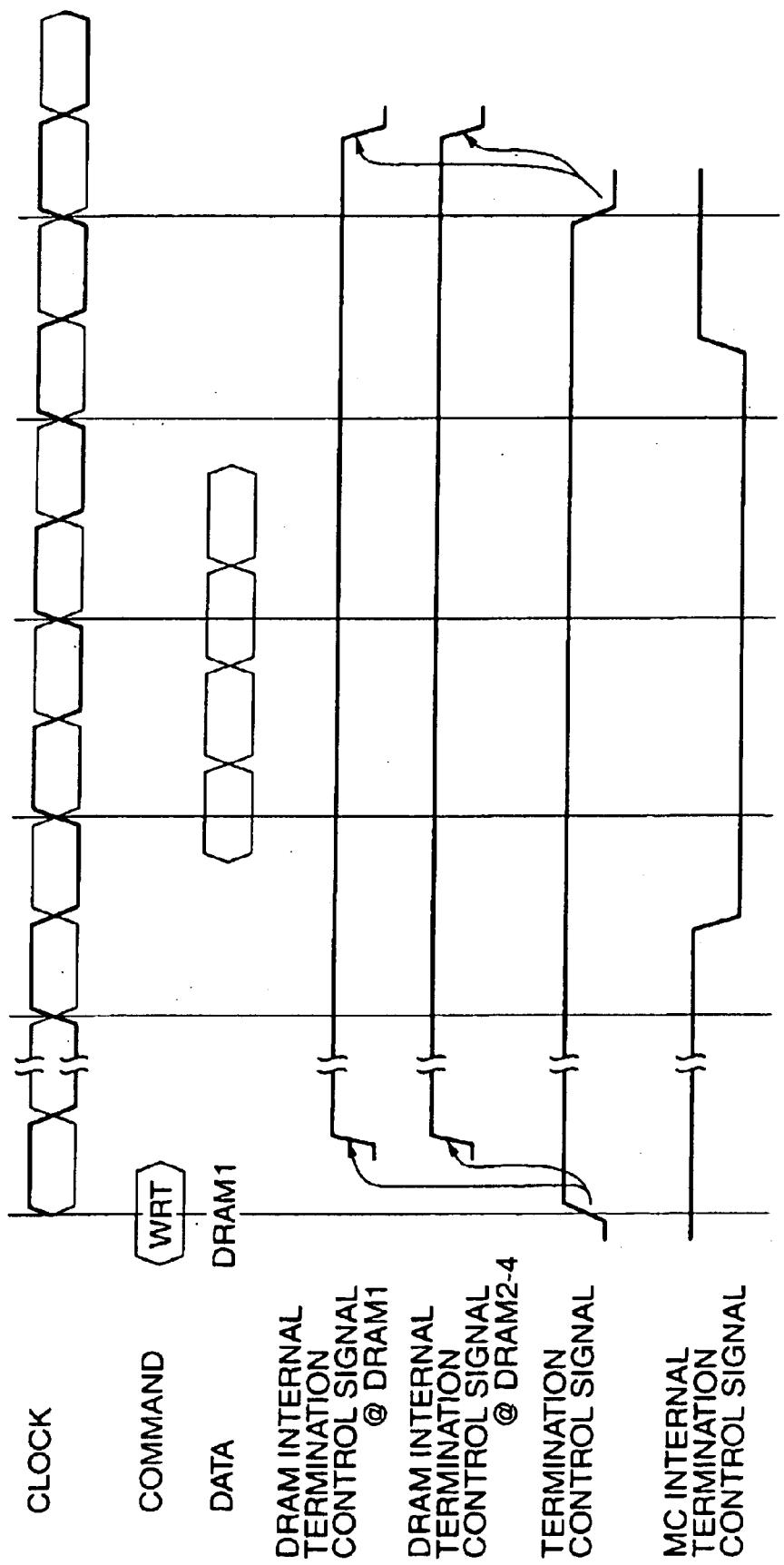

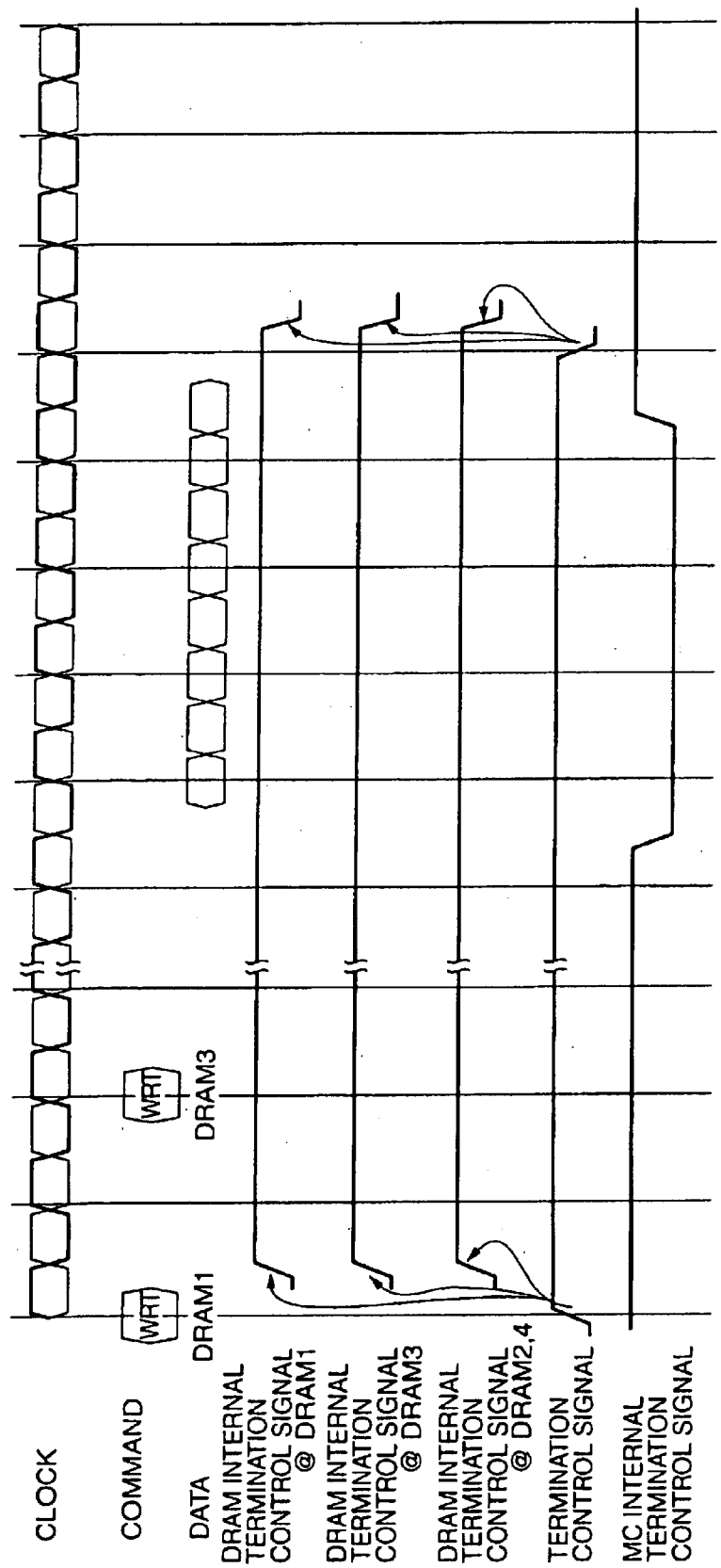
FIG.7 TERMINATION CONTROL UPON WRITE OPERATION OF DRAM1/3

| Config | Write to | DQ Active termination resistance | | | | | |
|---|---|---|---|---|---|---|---|
| | | MC | DRAM at Slot1 | | DRAM at Slot2 | | |
| | | | DRAM1 | DRAM2 | DRAM3 | DRAM4 | |
| 2R/2R | Slot1 | off | on | on | on | on | |
| | Slot2 | off | on | on | on | on | |
| 2R/1R | Slot1 | off | on | on | on | x | |
| | Slot2 | off | on | on | on | x | |
| 1R/2R | Slot1 | off | on | x | on | on | |
| | Slot2 | off | on | x | on | on | |
| 1R/1R | Slot1 | off | on | x | on | x | |
| | Slot2 | off | on | x | on | x | |
| 2R/Empty | Slot1 | off | x | on | x | x | |
| Empty/2R | Slot2 | off | on | x | on | x | |
| 1R/Empty | Slot1 | off | on | x | x | x | |
| Empty/1R | Slot2 | off | x | x | on | x | |

FIG.8

TERMINATION CONTROL UPON WRITE OPERATION
FOR VARIOUS SYSTEM STRUCTURES

| Config | Read from | DQ Active termination resistance | | | | | |
|---|---|---|---|---|---|---|---|
| | | MC | DRAM at Slot1 | | DRAM at Slot2 | | |
| | | | DRAM1 | DRAM2 | DRAM3 | DRAM4 | |
| 2R/2R | Slot1 front | on | off | on | on | on | |
| | Slot1 back | on | on | off | on | on | |
| | Slot2 front | on | on | on | off | on | |
| | Slot2 back | on | on | on | on | off | |
| 2R/1R | Slot1 front | on | off | on | on | X | |
| | Slot1 back | on | on | off | on | X | |
| | Slot2 | on | on | on | off | X | |
| 1R/2R | Slot1 | on | off | X | on | on | |
| | Slot2 front | on | on | X | off | on | |
| | Slot2 back | on | on | X | on | off | |
| 1R/1R | Slot1 | on | off | X | on | X | |
| | Slot2 | on | on | X | off | X | |
| 2R/Empty | Slot1 front | on | off | on | X | X | |
| | Slot1 back | on | on | off | X | X | |
| Empty/2R | Slot2 front | on | X | X | off | on | |
| | Slot2 back | on | X | X | on | off | |
| 1R/Empty | Slot1 | on | off | X | X | X | |
| Empty/1R | Slot2 | on | X | X | off | X | |

TERMINATION CONTROL UPON READ OPERATION
FOR VARIOUS SYSTEM STRUCTURES

FIG.9

MEMORY DEVICE AND MEMORY SYSTEM

BACKGROUND OF THE INVENTION

This invention relates to a memory device operable at a high speed and a memory system comprising a plurality of memory systems of the type.

Recently, memory devices are highly integrated while an interface for operating the memory devices at a high speed and with a low signal amplitude is developed. As a standard for such interface, proposal is made of SSTL (Stub Series Termination Logic). In order to operate a DRAM (Dynamic Random Access Memory) as one of memory devices at a high speed, proposal is also made of a DDR (Double Data Rate) solution in which a data rate can be doubled by carrying out data input/output in synchronism with both of leading and trailing edges of each clock.

A memory system for carrying out the above-mentioned operation has a structure in which a plurality of memory modules are arranged on a mother board in parallel to one another with a space left from one another. In this case, the memory modules are mounted on the mother board through a plurality of connectors, respectively. In order to fix each memory module to the mother board, each connector has a slot to receive the memory module. In each slot, a plurality of terminals pl are arranged for electrical connection with the memory module. On the other hand, the memory module is provided with a plurality of memory devices and a plurality of buffers, such as registers, mounted on a front side and/or a back side thereof. The memory devices and the registers are electrically connected to the connectors through a plurality of terminals formed on an end portion of the memory module.

One of memory systems of the type further comprise a controller, called a chip set, mounted on the mother board to control the memory devices on the memory modules. In this memory system, a data bus, a command address bus, and a clock bus (in the following description, these buses may collectively and simply be called a bus) are arranged on the mother board. Through these buses, the controller is electrically connected to the memory devices and the registers on the memory modules.

For example, the above-mentioned buses are connected in the following manner. The data bus and the clock bus from the controller are directly connected to the memory devices on the memory modules. On the other hand, the command address bus is connected through the registers to the memory devices on the memory modules.

Furthermore, a memory system according to the SSTL standard has a structure in which DRAM's as memory devices in each memory module are connected to a connector through stubs pl. As a specific example, disclosure is made of a memory system in which DRAM's as memory devices are mounted on both sides of a memory module fitted to a slot of a connector. The DRAM's mounted on the both sides of the memory module are connected to a data bus through stubs.

For the memory system of the type, it is considered to supply a clock bus with clocks having a frequency of 100 MHz or more (for example, 133 MHz) in order to perform input/output at a higher speed. In this case, the data rate upon reading/writing is not lower than 200 MHz if the DDR is adopted. Recently, it is required to operate each memory module at a clock frequency of 200 to 400 MHz. In this case, the data rate is as high as 400 to 800 MHz.

Referring to FIG. 1, description will be made of a related memory system. The memory system illustrated in the figure comprises a memory controller 21 mounted on a mother board (not shown), a plurality of memory modules 201 and 202 fitted to a plurality of slots (not shown) on the mother board, a clock generator 101 for generating write clocks, and a clock generator 102 for generating read clocks Each of the memory modules 201 and 202 mounted on the mother board is provided with a plurality of DRAM's. In each slot, a connector (not shown) is arranged. In the illustrated example, the DRAMf and the DRAMr are arranged on front and back sides of each memory module, respectively. Each of the DRAMf and the DRAMr is connected through stubs on the connector and the memory module to a data bus DB, a command address bus CB, a write clock bus WB, and a read clock bus RB.

Each bus is branched on the memory module so as to be connected to the DRAMf and the DRAMr formed on the front and the back sides of each of the memory modules 201 and 202. In the illustrated example, the command address bus CB includes a control signal line for transmission and reception of a termination control signal. The write clock bus WB is supplied with the write clocks from the clock generator 101. On the other hand, the read clock bus RB is supplied with the read clocks from the clock generator 102. The memory controller 21 is connected to each of the DRAMf and the DRAMr through the data bus DB and the command address bus CB.

The memory system being illustrated has a large capacity and is operable at a high speed. As shown in the figure, in the memory system, one end of the data bus DB is connected to the controller 21. On the other hand, the other end, i.e., a far end of the data bus DB is connected to a termination resistor (not shown) as a terminating element. The termination resistor is applied with an electric voltage from a termination power supply (not shown). However, in the above-mentioned memory system in which the DRAM's are connected to the data bus DB branched at each connector and at each stub, termination only at the far end of the data bus DB brings about unnegligible deterioration of the signal quality due to signal reflection resulting from mismatching of wiring impedance of the data bus DB. Therefore, it is found out that the above-mentioned termination scheme can not cope with the memory system operable at a high speed.

SUMMARY OF THE INVENTION

It is an object of this invention to provide a memory system comprising a plurality of memory devices connected to a data bus in a branched arrangement, which is capable of reading data from the memory devices at a high speed by effectively preventing reflection between the data bus and each memory device.

It is another object of this invention to provide a memory device which is capable of carrying out antireflection control adapted to a read state or a write state.

According to an aspect of this invention, there is provided a memory device to be connected to a data bus, the memory device comprising an active termination circuit for controllably terminating the memory device and a control circuit for controllably putting the active termination circuit into an electrically active state or an electrically inactive state.

For example, the control circuit is responsive to a termination control signal supplied from the outside of the memory device to put the active termination circuit into an active state or an inactive state and a data output enable signal produced in the memory device. The control circuit produces an internal termination control signal from the termination control signal and the data output enable signal.

In this event, the control circuit comprises a receiver supplied with the termination control signal and a clock signal for receiving the termination control signal in synchronism with the clock signal, and a termination control section for producing the internal termination control signal in response to the termination control signal received by the receiver and the data output enable signal. Alternatively, the control circuit may comprise a receiver for receiving the termination control signal in asynchronism with a clock signal, and a termination control section for producing the internal termination control signal in response to the termination control signal received by the receiver and the data output enable signal.

Alternatively, the control circuit produces the internal termination control signal in response to a termination control signal supplied from the outside of the memory device to put the active termination circuit into an active state or an inactive state, a data output enable signal produced in the memory device, and a power down signal.

The active termination circuit comprises a pair of transistors different in channel (or conductive) type from each other, a resistor circuit connected in series between the transistors, and an inverter connected to one of the transistors. By turning on and off the transistors, the memory device is put into an active state or an inactive state.

According to another aspect of this invention, there is provided a memory system comprising a plurality of memory devices connected to a single data bus, wherein each of the memory devices comprises a control circuit for producing an internal termination control signal indicating an inactive state when data are delivered to the data bus and when a termination control signal is received from the outside, and a termination circuit to be kept in an inactive state when the internal termination control signal indicates an inactive state. In this case, the memory system further comprises a memory controller connected to the data bus and connected to each memory device through a control signal line. The memory controller comprises a termination circuit selectively put into an active state or an inactive state when the memory devices are accessed.

According to still another aspect of this invention, there is provided a memory system comprising a plurality of memory devices connected to a single data bus and a memory controller connected through the data bus to the memory devices, wherein the memory controller comprises a termination circuit selectively put into an active state or an inactive state when the memory devices are accessed and a control unit for delivering a termination control signal to the memory devices when the memory devices are accessed, each memory device comprising a control circuit responsive to the termination control signal from the memory controller for producing an internal termination control signal and an active termination circuit to be put into an inactive state when the internal termination control signal indicates an inactive state. The memory controller comprises means for producing the termination control signal requesting to put the active termination circuits of the memory devices connected to the data bus into an active state when a read command or a write command is issued to a particular one of the memory devices. The termination circuit of the memory controller is put into an active state when the read command is produced and put into an inactive state when the write command is produced to the particular memory device and data are written into the particular memory device.

When the read command is received, the control circuit of the particular memory device receives from the memory controller the termination control signal indicating an active state and delivers the internal termination control signal indicating an inactive state to the active termination circuit of the particular memory device upon reading the data from the particular memory device. On the other hand, when the write command is received, data are written into the particular memory device while the active termination circuit of the particular memory device is kept in an active state.

According to yet another aspect of this invention, there is provided a termination control method for a memory system comprising a plurality of memory devices connected to a single data bus and a memory controller connected through the data bus to the memory devices, the method comprising the steps of issuing a read command from the memory controller to a particular one of the memory devices, maintaining a termination circuit of the memory controller in an active state upon issuance of the read command, maintaining active termination circuits in the memory devices except the particular memory device in an active state upon issuance of the read command and during a data read operation from the particular memory device in response to the read command, and maintaining the active termination circuit of the particular memory device in an inactive state upon issuance of the read command and during the data read operation from the particular memory device in response to the read command.

The termination control method further comprises the steps of issuing a write command to the particular memory device, maintaining the termination circuit of the memory controller in an inactive state upon issuance of the write command and during output of write data, and maintaining the active termination circuits of the memory devices including the particular memory device in an active state upon issuance of the write command.

BRIEF DESCRIPTION OF THE DRAWING

FIG. 5 is a time chart for describing another example of the termination control of the memory system illustrated in FIG. 2 during the read operation;

FIG. 6 is a time chart for describing one example of the termination control of the memory system illustrated in FIG. 2 during a write operation;

FIG. 7 is a time chart for describing another example of the termination control of the memory system illustrated in FIG. 2 during the write operation;

FIG. 8 is a view for describing termination control of the memory system during a write operation with respect to various combinations of memory devices (DRAM's);

FIG. 9 is a view for describing termination control of the memory system during a read operation with respect to various combinations of the memory devices (DRAM's);

DESCRIPTION OF THE PREFERRED EMBODIMENTS

Figure 1:
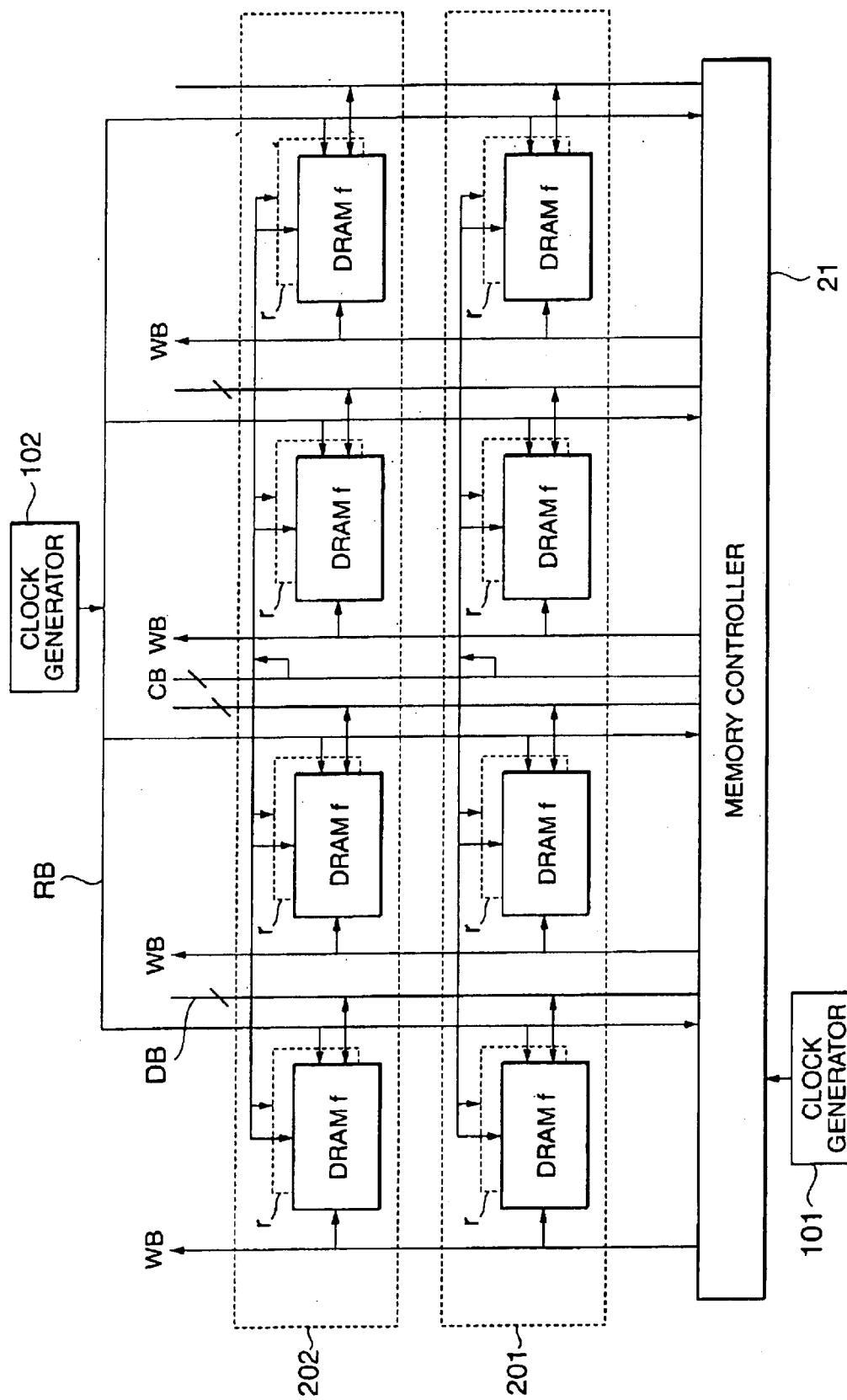
FIG. 1 is a view for describing a related memory system.
Figure 2:
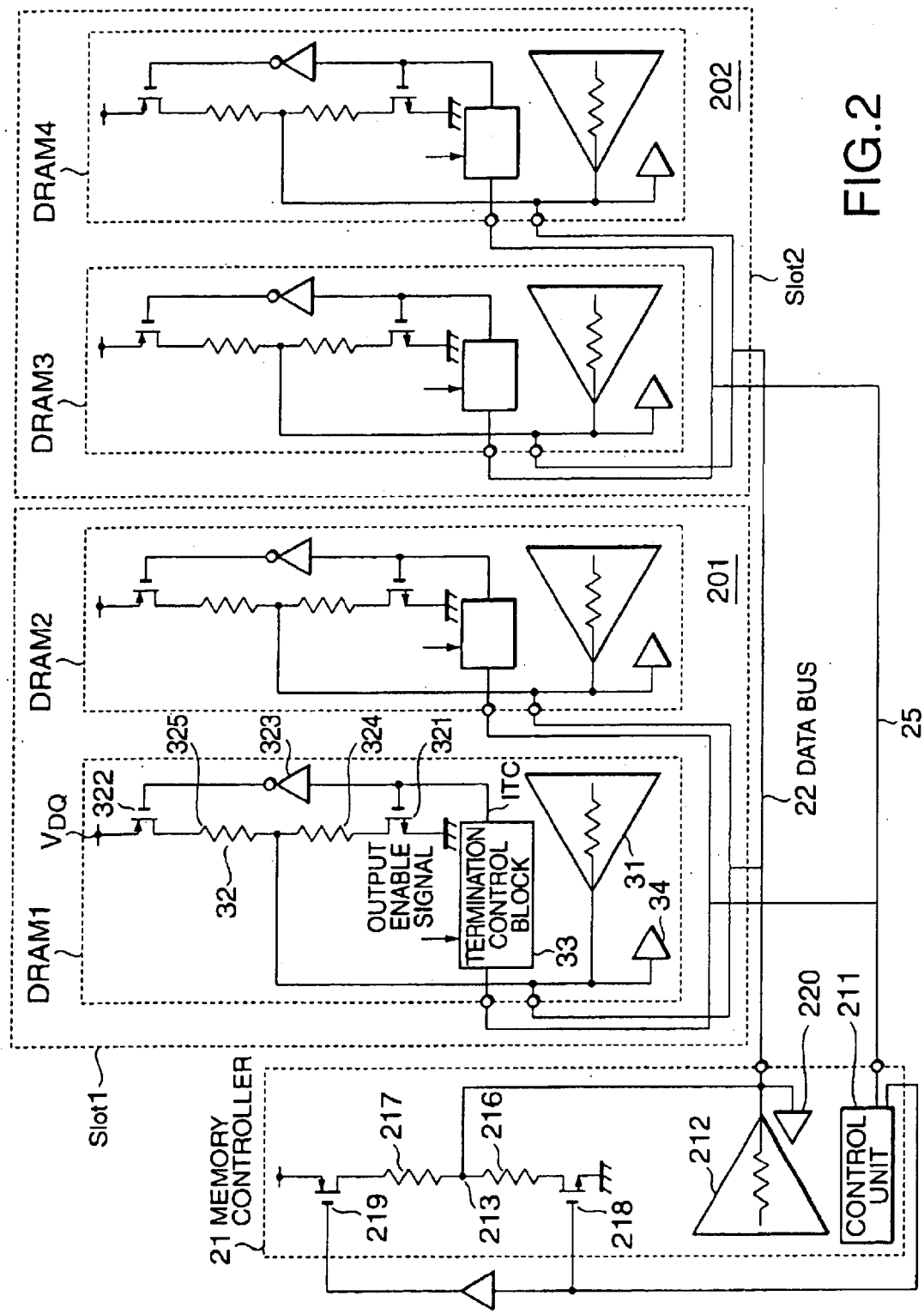
FIG. 2 is a block diagram of a memory system according to one embodiment of this invention.

Referring to FIG. 2, description will be made of a memory system according to one embodiment of this invention. The memory system comprises a plurality of connectors (not shown) arranged on a mother board (not shown) and having a plurality of slots Slot1 and Slot2, respectively, and a plurality of memory modules 201 and 202 inserted into the slots Slot1 and Slot 2, respectively. The memory modules 201 and 202 are provided with a DRAM1, a DRAM2, a DRAM3, and a DRAM4 as memory devices mounted on front and back sides thereof. Specifically, DRAM1 and DRAM3 are mounted on the front sides of the memory modules 201 and 202, respectively, while DRAM2 and DRAM4 are mounted on the back sides of the memory modules 201 and 202, respectively. On the mother board, a memory controller 21 is mounted together with the connectors.

The memory controller 21 is connected to the DRAM1, the DRAM2, the DRAM3, and the DRAM4 of the memory modules 201 and 202 through a single data bus 22. As seen from the figure, a pair of the DRAM1 and the DRAM2 and a pair of the DRAM3 and the DRAM4 are connected to the data bus 22 through the slots Slot1 and Slot2 of the connectors, respectively. The memory controller 21 is connected to the DRAM1, the DRAM2, the DRAM3, and the DRAM4 through a control signal line 25.

The memory controller 21 comprises a control unit 211 for delivering a termination control signal to the control signal line 25, a driver 212 for delivering data to the data bus 22 upon carrying out a data write operation, a receiver 220 for receiving data from the data bus 22 upon carrying out a data read operation, and a termination circuit 213 to be put into an operating state in case where the data are read from the DRAM1, the DRAM2, the DRAM3, and the DRAM4. The driver 212 and the receiver 220 are selectively connected to the termination circuit 213 under control of the control unit 211 as will later be described.

The termination circuit 213 of the memory controller 21 comprises a pair of resistors 216 and 217 connected in series and N-channel and P-channel MOS transistors 218 and 219 connected to both ends of a series of the resistors 216 and 217. The N-channel MOS transistor 218 has a source connected to ground. The P-channel MOS transistor 219 has a source supplied with a power-supply voltage $V_{DQ}$. The power-supply voltage $V_{DQ}$ is common to the power-supply voltage supplied to each of the DRAM1, the DRAM2, the DRAM3, and the DRAM4 as the memory devices. In the illustrated example, a common connecting point between the resistors 216 and 217 is connected to the data bus 22. If the resistors 216 and 217 are equal in resistance to each other, the data bus 22 is terminated at a termination voltage of $V_{DQ}/2$ while the MOS transistors 218 and 219 are turned on. The MOS transistors 218 and 219 are turned on and off in response to a control signal from the control unit 211.

On the other hand, the DRAM1, the DRAM2, the DRAM3, and the DRAM4 illustrated in FIG. 2 have a same structure. Therefore, description will be made of the structure of the DRAM1 by way of example. It is assumed here that a read command or a write command is delivered to the DRAM1.

The DRAM1 comprises a driver 31 for delivering read data to the data bus 22, an active termination circuit 32 arranged inside the DRAM1, a termination control block 33 for controlling the active termination circuit 32, and a receiver 34 for receiving write data from the data bus 22. As will later be described, the driver 31 and the receiver 34 are selectively connected to the active termination circuit 32 under control of the termination control block 33.

The DRAM1 produces an output enable signal in response to the read or the write command. Supplied with a termination control signal from the outside of the DRAM1 and the output enable signal produced in the DRAM1 in response to the read or the write command, the termination control block 33 produces an internal termination control signal ITC which is delivered to the active termination circuit 32.

The active termination circuit 32 in each DRAM illustrated in FIG. 2 comprises an N-channel MOS transistor 321, a P-channel MOS transistor 322, an inverter 323, and a pair of resistors 324 and 325 connected in series to each other between the MOS transistors 321 and 322. The common connecting point of the resistors 324 and 325 is connected to the data bus 22 together with the driver 31 and the receiver 34. The P-channel MOS transistor 322 has a source supplied with the power-supply voltage $V_{DQ}$ from a power supply used for a memory section of the DRAM1. Thus, the active termination circuit 32 uses the power supply common to the memory section so that a special power supply for the termination circuit is unnecessary.

It is assumed here that the resistors 324 and 325 are equal in resistance to each other. As described above, the common connecting point between the resistors 324 and 325 is connected to the data bus 22. When the MOS transistors 321 and 322 are turned on, the power-supply voltage $V_{DQ}$ is divided by the resistors 324 and 325 so that the terminal voltage of $V_{DQ}/2$ is supplied to the data bus 22. Thus, with the above-mentioned structure, the data bus 22 is terminated at the voltage of $V_{DQ}/2$ in case where the active termination circuit 32 is put in an active state, i.e., a valid state. On the other hand, when the MOS transistors 321 and 322 are turned off, the active termination circuit 32 is put into an inactive state, i.e., an invalid state to be opened.

Figure 3:
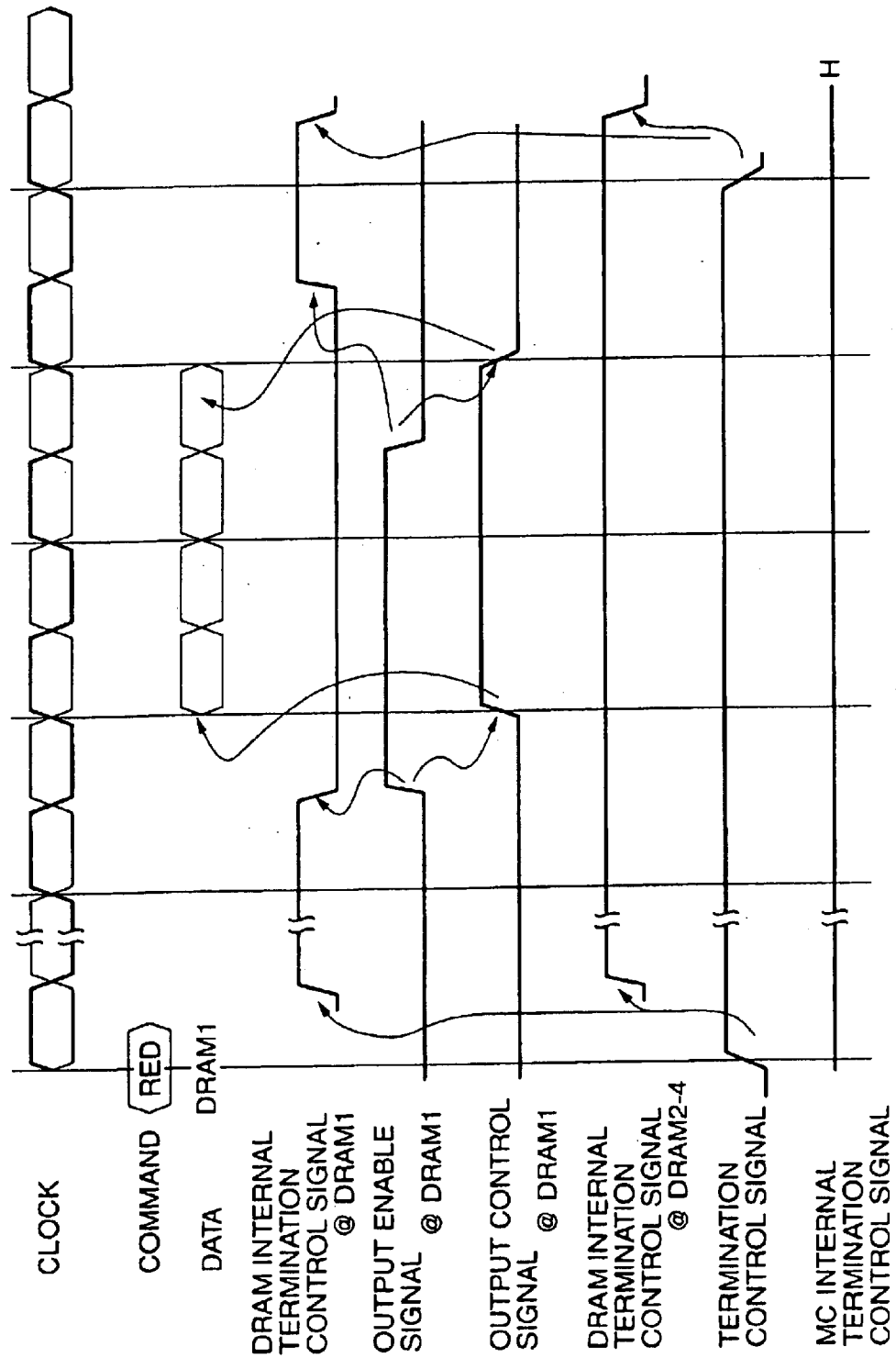
FIG. 3 is a time chart for describing one example of termination control of the memory system illustrated in FIG. 2 during a read operation.

Referring to FIG. 3 in addition, description will be made of the case where the DRAM1 illustrated in FIG. 2 is supplied with the read command (RED). Although not shown in the figure, each DRAM is supplied with clocks through a clock bus. It is assumed here that, in the illustrated example, a so-called DDR technique in which data are read or written at leading and trailing edges of each clock is used.

At first, consideration will be made of the state where the DRAM1 is not accessed. The termination control block 33 delivers the internal termination control signal ITC having a low (L) level to the active termination circuit 32 to turn off the MOS transistors 321 and 322. As a consequence, the active termination circuit 32 is put in an inactive state. This also applies to all of the DRAM2, the DRAM3, and the DRAM4 as the remaining memory devices. On the other hand, the termination circuit 213, i.e., the terminating element in the memory controller 21 is kept in an active state because the MOS transistors 218 and 219 are turned on in response to the control signal. As a consequence, the data bus 22 is maintained at the terminal voltage ($V_{DQ}/2$). Thus, in such unaccessed state, the active termination circuits 32 in the DRAM1, the DRAM2, the DRAM3, and the DRAM4 do not consume electric current so that electric power required in the memory system as a whole can be saved.

Simultaneously when the read command (RED) is issued and delivered through a command bus (not shown) to the DRAM1, the control unit 211 of the memory controller 21 delivers the termination control signal of a high (H) level to the control signal line 25. As a consequence, the termination control blocks 33 of the DRAM1, the DRAM2, the DRAM3, and the DRAM4 connected to the control signal line 25 are supplied with the termination control signal of a H level.

In response to the termination control signal of a H level from the memory controller 21, the internal termination control signal ITC in each of the DRAM1, the DRAM2, the DRAM3, and the DRAM4 is given a H level. This state is shown in @DRAM1 and @DRAM2–4 in FIG. 3. As a consequence, the active termination circuits 32, i.e., the terminating elements in all of the DRAM1, the DRAM2, the DRAM3, and the DRAM4 are put into an active state.

When the active termination circuit 32 is put into an active state, the DRAM1 supplied with the read command delivers the read data to the data bus 22 after a predetermined clock latency. Prior to delivery of the read data, the DRAM1 puts the active termination circuit 32 into an inactive state (L level) under control of the termination control block 33 as shown in @DRAM1 in FIG. 3 and makes the output enable signal @DRAM have a H level. When the output enable signal is given a H level, the output control signal for the memory element in the DRAM1 is given a H level in synchronism with the clock.

On the other hand, when the output enable signal is given a H level, the internal termination control signal ITC is given a L level. The control operation for the active termination circuit 32 is carried out by the termination control block 33 in the DRAM1 by making the internal termination control signal ITC have a L or a H level.

When the output control signal for the memory element is given a H level, the DRAM1 carries out the read operation. Specifically, according to the DDR (Double Data Rate) technique, the data are read from the DRAM1 in a burst fashion in synchronism with leading and trailing edges of each clock. In the illustrated example, the data have a continuous burst length equal to four.

Figure 4:
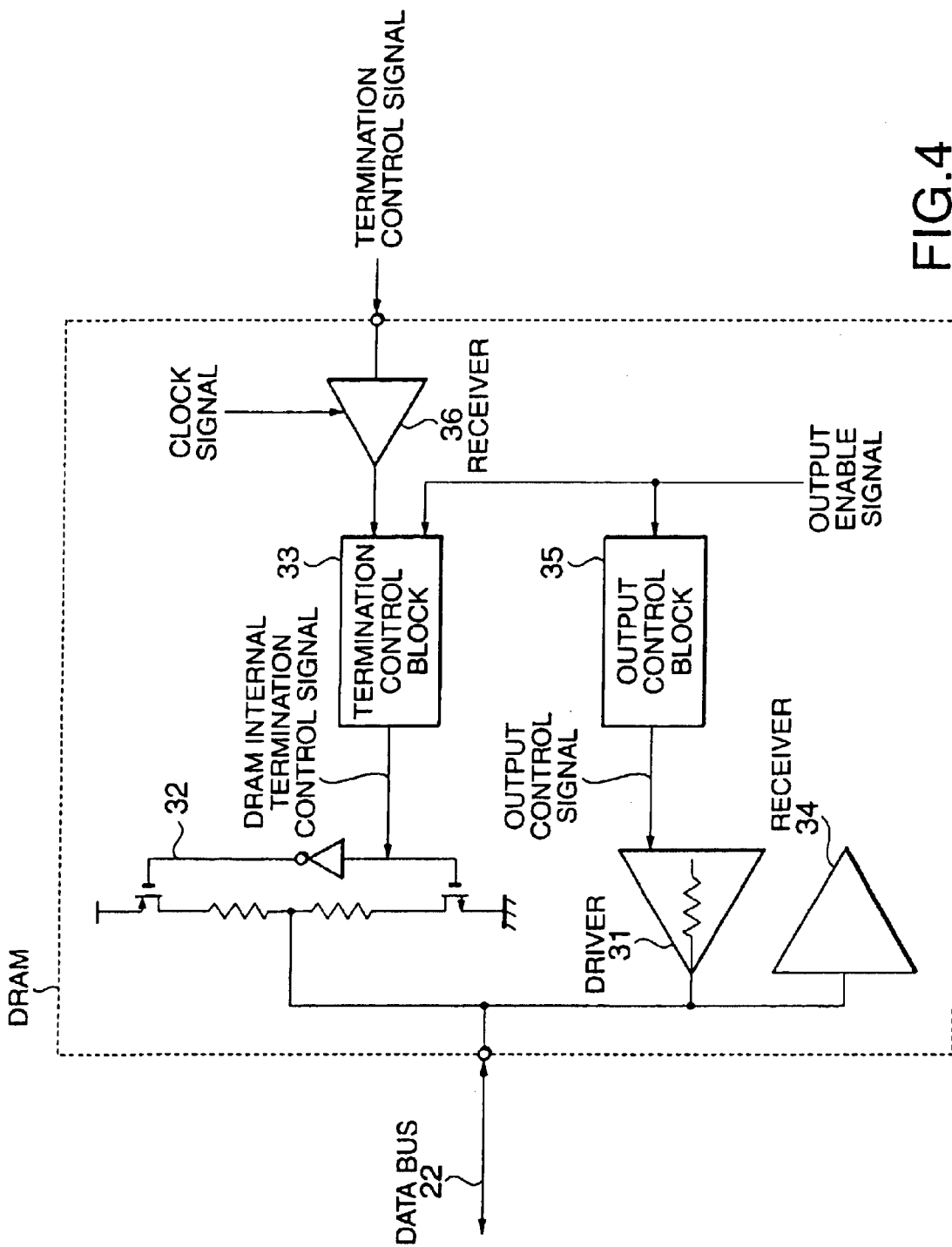
FIG. 4 is a block diagram of a DRAM used in the memory system illustrated in FIG. 2.

Referring to FIGS. 3 and 4, description will be made of an operation in each of the DRAM1, the DRAM2, the DRAM3, and the DRAM4. In addition to the driver 31, the receiver 34, the active termination circuit 32, and the termination control block 33 illustrated in FIG. 2, the DRAM comprises an output control block 35 and a control signal receiver 36 operating in response to the termination control signal and the clock signal, as shown in FIG. 4. Supplied with the termination control signal from the control unit 211 (FIG. 2) and the read command (RED) through the control bus, a DRAM internal controller (not shown) delivers the output enable signal to the termination control block 33 and the output control block 35 illustrated in FIG. 4.

Supplied with the termination control signal through the control signal receiver 36 and the output enable signal, the termination control block 33 gives a L level to the DRAM internal termination control signal produced by the termination control block 33 to put the active termination circuit 32 of the DRAM into an inactive state, i.e., an invalid state.

On the other hand, the output control block 35 supplied with the output enable signal delivers the output control signal to the driver 31 at the timing of the clock signal. In this state, the DRAM1 delivers the data in a burst fashion until the output enable signal is given a L level and the output control signal is given a L level in synchronism with the clock signal, as illustrated in FIG. 3.

On the other hand, for each of the DRAM2, the DRAM3, and the DRAM4 which are not supplied with the read command (RED), the output enable signal is not produced. Therefore, supplied with the DRAM internal termination control signal obtained from the termination control signal supplied from the control unit 211, the termination control block 33 of each of the DRAM2, the DRAM3, and the DRAM4 straightforwardly passes the DRAM internal termination control signal to the active termination circuit 32. As a consequence, the active termination circuit 32 of each of the DRAM2, the DRAM3, and the DRAM4 except the DRAM1 is continuously kept in an active state. This state continues until the termination control signal is given a L level and, consequently, the DRAM internal termination control signal is given a L level. As shown at a bottom line in FIG. 3, the termination circuit in the memory controller 21 is continuously supplied with a memory controller (MC) internal termination control signal of a H level. Therefore, the termination circuit is continuously kept in an active state and can receive the data from the DRAM1 without reflection.

Thus, in the memory system being illustrated, only the active termination circuit 32 of the DRAM to be subjected to the read operation is put in an inactive state. The active termination circuits of other DRAM's and the termination circuit in the memory controller are put in an active state. It is therefore possible to avoid the influence by reflection.

After the data from the DRAM 1 are delivered in a burst fashion, the memory controller 21 makes the termination control signal have a L level. Supplied with the termination control signal of a L level, all of the DRAM's on the data bus 22 makes the DRAM internal termination control signal have a L level to bring the active termination circuit 32 in each DRAM into an inactive state. Thereafter, the level of the data bus 22 is held by the termination circuit in the memory controller 21.

In the timing chart illustrated in FIG. 3, the control unit 211 of the memory controller 21 delivers the termination control signal of a H level to the control signal line 25 simultaneously when the read command (RED) is issued. Alternatively, if the active termination circuit 32 in DRAM1 is turned into an inactive state before the data are delivered from the DRAM1 as an output burst, the termination control signal of an H level may be delivered at a timing delayed from the read command (RED).

Next referring to FIG. 5, description will be made of an operation in case where the memory controller 21 continuously issues the read commands to the DRAM1 and the DRAM3. Generally, in case where the read operation is continuously carried out from different DRAM's, a time gap is provided between clock signals in order to avoid collision of data at the output driver. Taking this into account, the next read command (RED) is produced at the lapse of three clocks in the example illustrated in FIG. 5.

At first, the read command (RED) is issued to the DRAM1 through the command bus. Then, the control unit 211 (FIG. 2) delivers the termination control signal to the control signal line 25. In this event, the termination circuit in the memory controller 21 is put in an active state. The operation in this case is similar to that described in conjunction with FIG. 4. The memory controller 21 delivers the termination control signal through the control signal line 25 to the DRAM1, the DRAM2, the DRAM3, and the DRAM4. Each of the DRAM1, the DRAM2, the DRAM3, and the DRAM4 makes the internal termination control signal have a H level (see @DRAM1, @DRAM3, @DRAM2,4 in FIG. 5).

Herein, a H level of the internal termination control signal of the DRAM2 and the DRAM4 continues until the read operation in the DRAM1 and the DRAM3 is completed. On the other hand, the internal control signal of the DRAM1 is given a L level in response to the output enable signal. This state continues until the data are read from the DRAM1. Upon completion of the data read operation from the DRAM1, the internal control signal of the DRAM1 is turned into a H level.

When the read command (RED) is issued to the DRAM3 following the DRAM1, the control unit 211 of the memory controller 21 keeps the termination control signal at a H level without turning into a L level after the data of the DRAM1 are delivered in a burst fashion. The termination control signal of a H level is turned into a L level after the data are delivered from the DRAM3 in a burst fashion.

As shown in FIG. 5, the internal termination control signal of the DRAM1 or the DRAM3 takes a L level while the data are delivered from the DRAM1 or the DRAM3 in a burst fashion. Thus, the active termination circuit 32 of the DRAM delivering the data is kept in an inactive state, i.e., an invalid state while the active termination circuit 32 in other DRAM's which are not involved in the read operation as well as the termination circuit of the memory controller 21 are kept in an active state.

As is obvious from the above, the memory controller 21 need not individually control the active termination circuits 32 of the respective DRAM's but controls the delivery of the termination control signal so as to cover the case where the memory system as a whole is accessed. In case where the active termination circuit 32 in each DRAM is switched, switching must be carried out at a high speed in proportion to the frequency of the clock signal. Such switching operation itself can easily be carried out under control of the internal control section in each DRAM.

In termination control in the memory controller 21, the termination circuit is put into an active state during a period after issuance of the read command (RED) and before the output from the DRAM itself. Therefore, a timing margin is large. This means that the memory controller 21 can easily control the memory system.

Referring to FIG. 6, description will be made of an operation in case where the write command (WRT) is issued to the DRAM1 of the memory system illustrated in FIG. 2. In this case, the write command (WRT) is at first issued to the DRAM1 through the command bus. Simultaneously, the memory controller 21 produces the termination control signal of a H level as shown in FIG. 6 and delivers the termination control signal to the control signal line 25. As a consequence, the active termination circuit 32 in each of the DRAM1, the DRAM2, the DRAM3, and the DRAM4 is put into an active state in response to the DRAM internal termination control signal, as seen from FIG. 6. Therefore, the data bus 22 is maintained at a termination voltage.

On the other hand, after the write command (WRT) is issued through the command bus, the memory controller 21 delivers the data to the data bus 22 in a burst fashion after a predetermined clock latency. Prior to delivery of the data to the data bus 22, the termination circuit in the memory controller 21 is put into an inactive state, i.e., an invalid state. Therefore, the gate of each of the MOS transistors 218 and 219 (FIG. 2) is supplied with the MC internal termination control signal of a L level from the control unit 211 (see FIG. 6). As seen from FIG. 6, the internal termination control signal in each of the DRAM1, the DRAM2, the DRAM3, and the DRAM4 is kept at a H level even if the memory controller internal termination control signal is turned into a L level. Therefore, the active termination circuit 32 in each of the DRAM1, the DRAM2, the DRAM3, and the DRAM4 maintains its active state. As a consequence, the active termination circuit 32 in each DRAM is connected to the data bus 22.

When the data are written in a burst fashion into the DRAM1 designated by the write command (WRT), the memory controller 21 makes the memory controller internal termination control signal have a H level and makes the termination control signal on the control signal line 25 have a L level. As a consequence, the internal termination control signal of the active termination circuit 32 in each of the DRAM1, the DRAM2, the DRAM3, and the DRAM4 connected to the data bus 22 is given a L level so that each of the active termination circuits 32 is put into an inactive state. Thereafter, the level of the data bus 22 is maintained again by the termination circuit in the memory controller 21.

In the timing chart shown in FIG. 6, the memory controller 21 makes the termination control signal have a H level simultaneously when the write command (WRT) is issued to the DRAM1. Alternatively, if the active termination circuit 32 in each DRAM is turned into an active state before the write data are delivered from the memory controller 21 in a burst fashion, the termination control signal may be given a H level at a timing delayed from the write command (WRT).

Next referring to FIG. 7, description will be made of an operation in case where the write commands (WRT) are continuously issued to the DRAM1 and the DRAM3. As seen from FIG. 7, when the write command (WRT) is issued to the DRAM1, the termination control signal on the control signal line 25 (FIG. 2) is given a H level. Therefore, the internal termination control signal in each of the DRAM1, the DRAM2, the DRAM3, and the DRAM4 is also given a H level. The active termination circuit 32 in each of the DRAM1, the DRAM2, the DRAM3, and the DRAM4 is put into an active state and the data bus 22 is applied with the termination voltage. After a predetermined clock latency, the data are written into the DRAM1 and the DRAM3 in a burst fashion. While the data are written in the DRAM1 and the DRAM3, the memory controller internal termination control signal is given a L level so that the termination circuit in the memory controller 21 is turned into an inactive state. Upon completion of the data write operation into the DRAM1 and the DRAM3, the memory controller internal termination control signal is given a H level and the termination control signal supplied to each of the DRAM1, the DRAM2, the DRAM3, and the DRAM4 is given a L level. As a consequence, the active termination circuit 32 in each of the DRAM1, the DRAM2, the DRAM3, and the DRAM4 is returned to an inactive state.

As is obvious from the above, the memory controller 21 simply transmits the termination control signal via the single control signal line 25 to all DRAM's and each DRAM produces the internal control signal to control the termination circuit of each DRAM. Thus, the memory system having a simple structure can transmit and receive the data at a high speed without the influence of reflection.

As described above, in the memory system illustrated in FIG. 2, the termination circuit transmitting the termination control signal is put into an inactive state while the termination circuit receiving the termination control signal is put into an active state. Thus, data transmission/reception is carried out in the state where the termination circuit receiving the data alone is connected while the termination circuit transmitting the data is disconnected. With this structure, the data can be transmitted and received between the transmitting and the receiving sides at a high speed without the influence of reflection.

The memory system illustrated in FIG. 2 has a structure in which two connectors are mounted on the mother board with the slots connected to the memory modules each of which has two DRAM's. However, in an actual memory system, various combinations are used in dependence upon the condition of use.

Referring to FIGS. 8 and 9, the memory system according to this invention may have various structures. Herein, the states of the DRAM's and the active termination circuit of the memory controller (MC) are shown in case where the number of slots is equal to two at maximum. FIG. 8 shows the state of the active termination circuit during the write operation. FIG. 9 shows the state of the active termination circuit during the read operation. In FIGS. 8 and 9, 1R and 2R represent the cases where one DRAM and two DRAM's are inserted in each slot, respectively. It is noted here that the DRAM in the slot is generally called RANK. "Empty" represents the case where no memory module is inserted in each slot.

In FIGS. 8 and 9, on and off represent the cases where the active termination circuit is in an active state and in an inactive state, respectively. x represents the case where no DRAM is connected.

As seen from FIG. 8, during the write operation, the termination circuit of the memory controller (MC) transmitting the data is kept in an off state while the termination circuit (active termination circuit) of each DRAM as a far end is kept in an on state.

As seen from FIG. 9, during the read operation, the termination circuit of the memory controller (MC) receiving the read data is turned on to be put in a valid state while only the termination circuit of the DRAM to be subjected to the read operation is turned off to be put in an invalid state. The termination circuit of the DRAM which is not subjected to the read operation is turned on to be kept in a valid state, i.e., an active state.

The memory system operable at a high frequency and the individual DRAM's are operable in synchronism with the clock signal. In order to cope with the high-frequency operation, the signal supplied to the DRAM is introduced into the DRAM with reference to the clock signal. However, in order to distribute the high-speed clock signal to the respective receiver circuits in the DRAM and to operate the receiver circuits, an internal DLL (Delay-Locked Loop) circuit and the receiver circuit operable at a high speed require large current consumption. For example, in case of the high-speed DRAM currently used, the current consumption is normally on the order of 80 mA at the power-supply voltage of 2.5V. Generally, the memory system of the type has a power down mode such that the operations of the clock signal, the DLL circuit, and the receiver circuit in the DRAM are stopped if the DRAM is not accessed. In the power down mode, current consumption can be reduced to about 3 mA.

In the memory system of this invention, it is assumed that the DRAM's of some RANKs have a power down mode. In this event, if the DRAM of another RANK is accessed, the termination circuit of the DRAM in the power down mode must be enabled or validated. Therefore, if the DRAM is in the power down mode and the clock signal is stopped, the termination control signal receiver circuit in the DRAM preferably has a circuit structure operable in asynchronism with the clock signal. In the system of this invention, the termination control signal need not operate at a speed as high as an operation frequency of the memory system. Therefore, the termination control signal receiver circuit can be operated in asynchronism with the clock signal.

Figure 10:
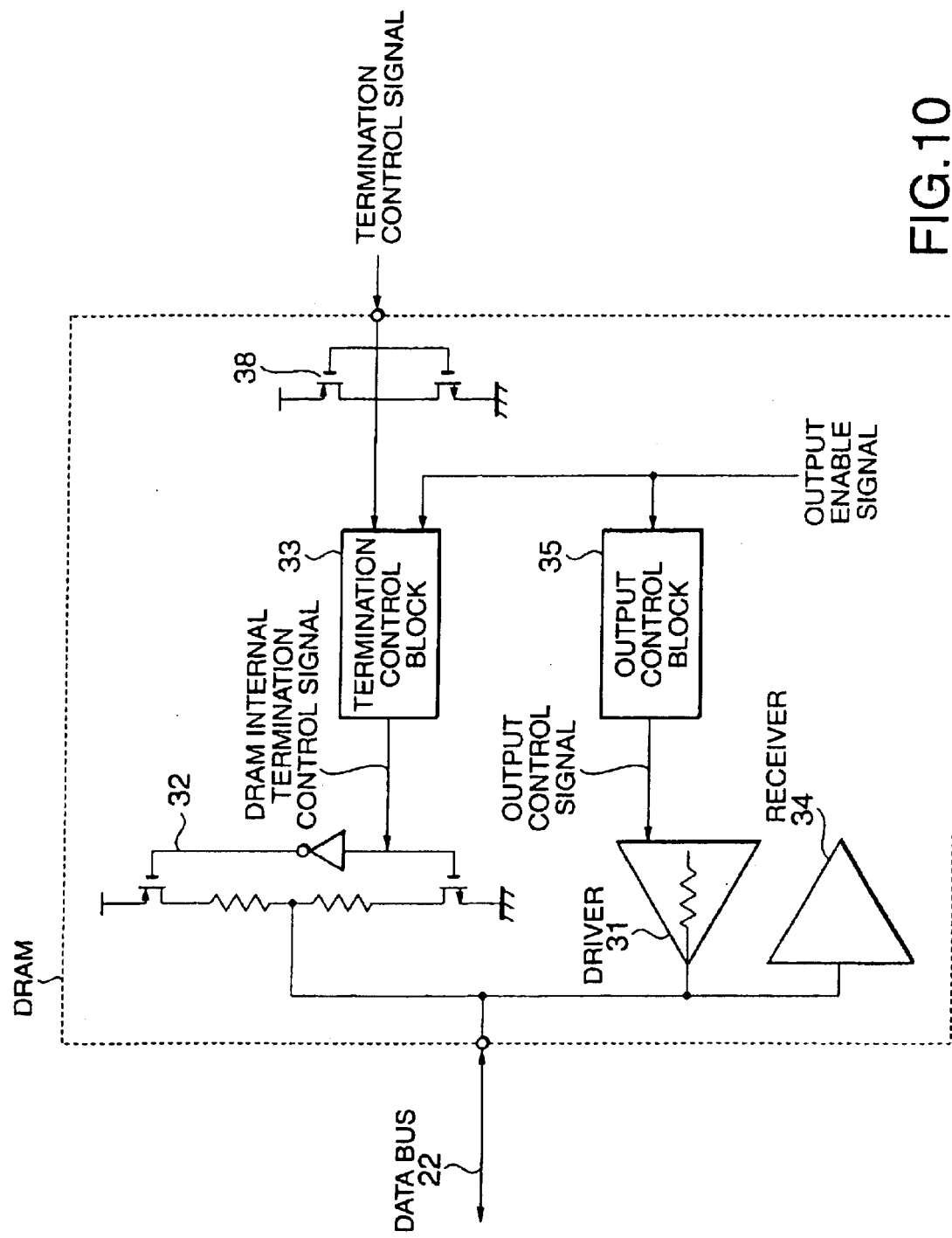
FIG. 10 is a block diagram of a DRAM adapted to perform a termination control operation in asynchronism with clocks in the memory system of the one embodiment.

Referring to FIG. 10, description will be made of a terminating section of a DRAM used as a memory device of a memory system according to another embodiment of this invention. The DRAM illustrated in FIG. 10 is different from the DRAM illustrated in FIG. 4 in that the receiver 36 is replaced by a CMOS inverter circuit as a termination control signal receiver circuit 38 for receiving the termination control signal. The termination control signal receiver circuit 38 illustrated in the figure is operable independent of the clock signal and delivers the termination control signal to the termination control block 33. Thus, the termination control signal receiver circuit 38 illustrated in the figure is operable in asynchronism with the clock signal.

In the memory system comprising the DRAM illustrated in FIG. 10, the memory controller delivers the termination control signal to the DRAM which is not accessed, in order to save the current consumption at the termination circuit in each DRAM. In this event, the termination circuit in each DRAM is put into an inactive state while the termination circuit of the memory controller alone is put into an active state.

In order to further reduce power consumption of the memory system by the use of the termination circuit illustrated in FIG. 10, it is proposed that all DRAM's have the power down mode. In case where all DRAM's have the power down mode, termination control may be carried out by invalidating the termination circuits in the DRAM's put in the power down mode. In this event, the memory controller need not control the termination control signal. With the above-mentioned structure, the memory controller can be easily controlled so that the memory system highly controllable is obtained. In this case, in order to control entry (start) or eject (end) of the power down mode, the memory controller delivers a power down control signal to the DRAM. As an example of such control system, description will be made of the control by a particular pin like a CKE (Clock Enable) signal in SDRAM (Synchronous Dynamic Random Access Memory). It is assumed here that the DRAM used herein has a function of automatically producing the power down control signal in the DRAM to invalidate the termination circuit if the entry of the power down mode is requested.

Figure 11:
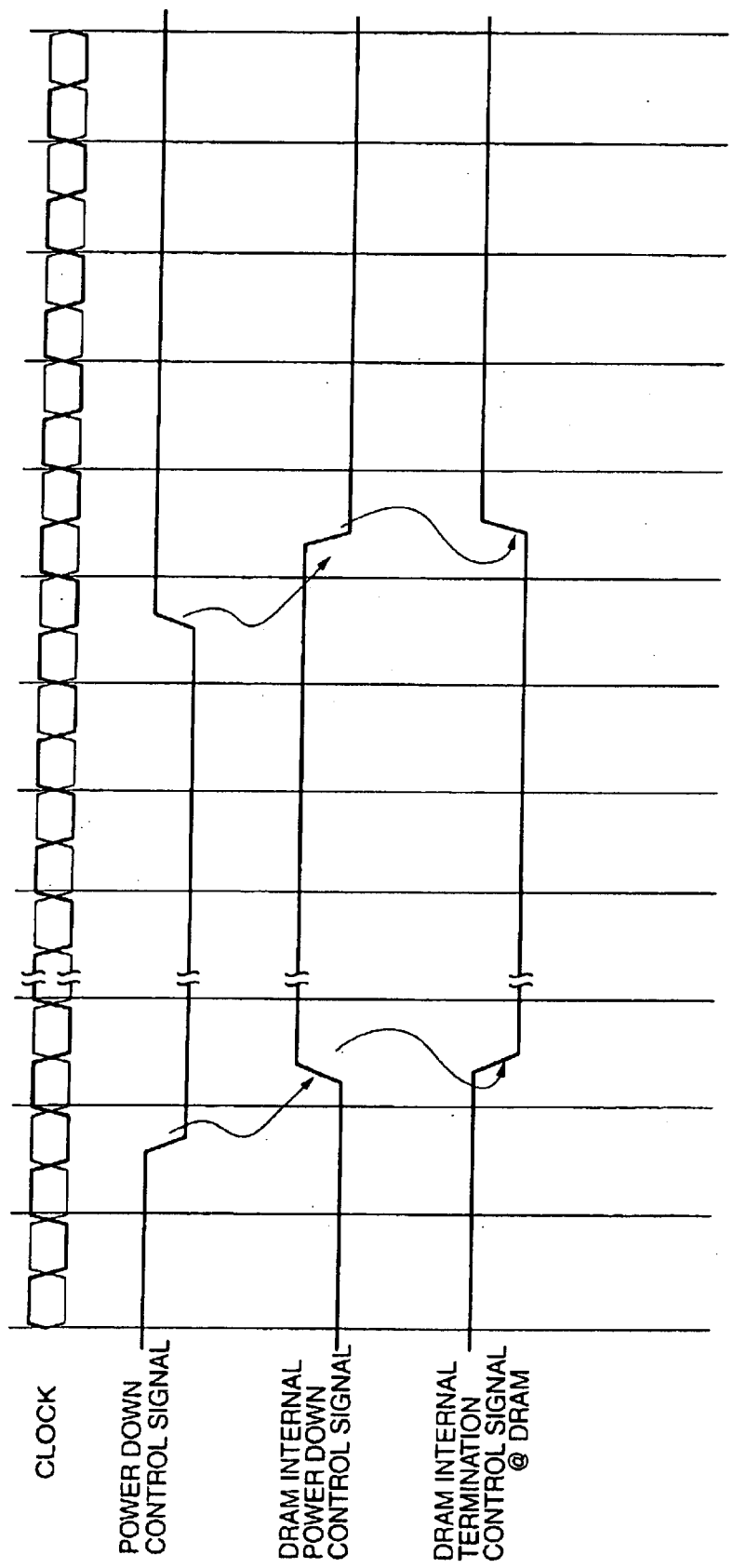
FIG. 11 is a time chart for describing termination control in a memory system according to another embodiment of this invention.

As shown in FIG. 11, when the power down control signal is supplied from the memory controller, an internal power down control signal is automatically produced in the DRAM. In response to the internal power down control signal, the DRAM internal termination control signal is produced.

Figure 12:
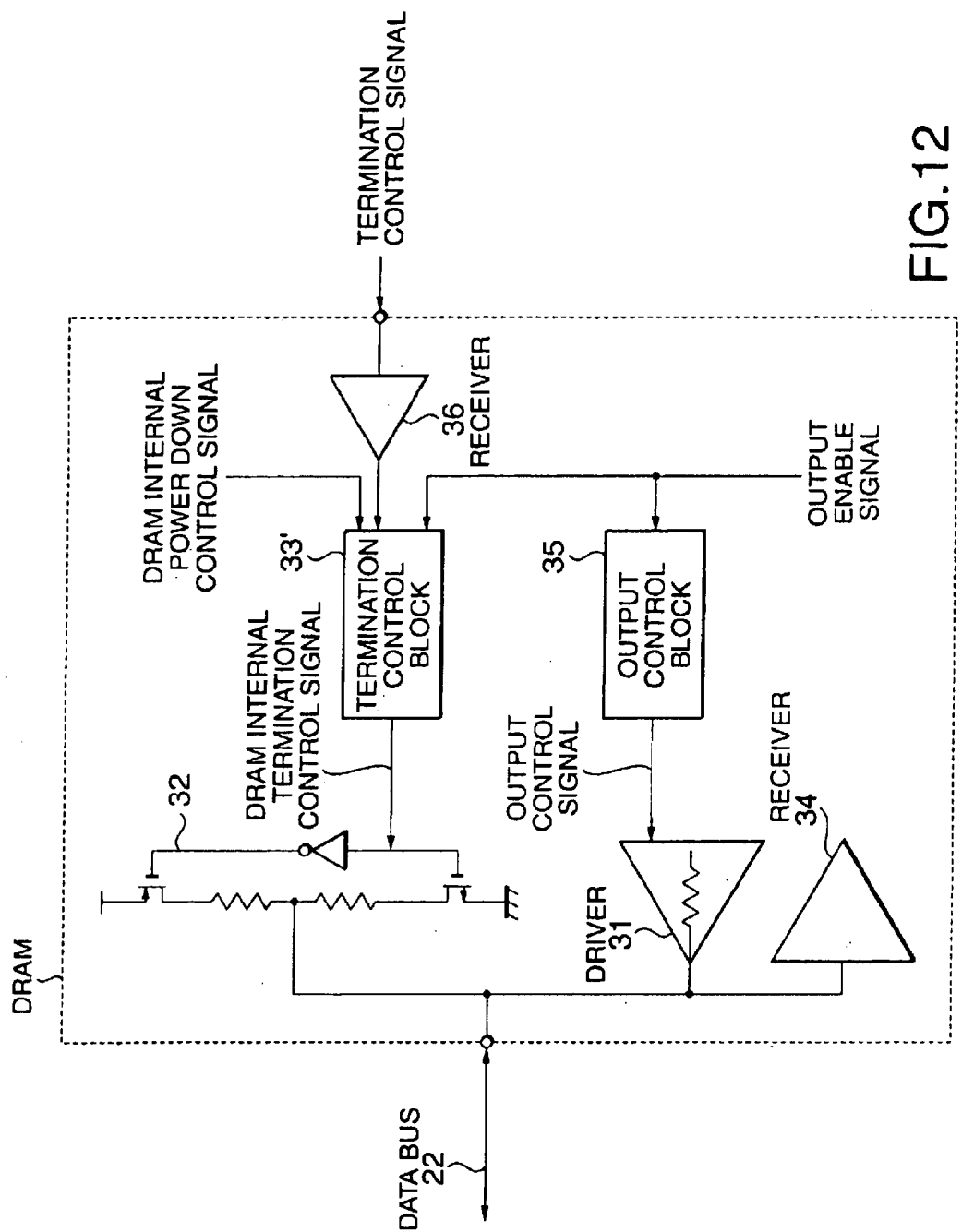
FIG. 12 is a block diagram of one example of a DRAM adapted to execute a termination control operation illustrated in FIG. 11.

Referring to FIG. 12, the DRAM has a structure for implementing the operation shown in FIG. 11. The DRAM illustrated in the figure has a function of producing the internal power down control signal in the DRAM when the power down control signal is supplied from the memory controller. The internal power down control signal is supplied to a termination control block 33'. The termination control block 33' illustrated in the figure is supplied with the termination control signal through the receiver 36, together with the output enable signal, like in FIG. 4.

In the above-mentioned structure, when the termination control signal of a H level is supplied and when the internal power down control signal and the output enable signal are supplied, the termination control block 33' makes the internal termination control signal have a L level to automatically put the active termination circuit 32 into an invalid state, i.e., an inactive state. In this case, the memory controller produces the termination control signal when the device condition is unstable upon turning on of the system power supply and the active termination circuit 32 must forcedly be invalidated or disabled to interrupt an unnecessary current path or when the active termination circuit 32 must be invalidated upon testing the DRAM. The termination control block 33' illustrated in the figure can easily be formed by a NAND circuit for the termination control signal, the internal power down control signal and the output enable signal. Therefore, the termination control block 33' is not described in detail.

Figure 13:
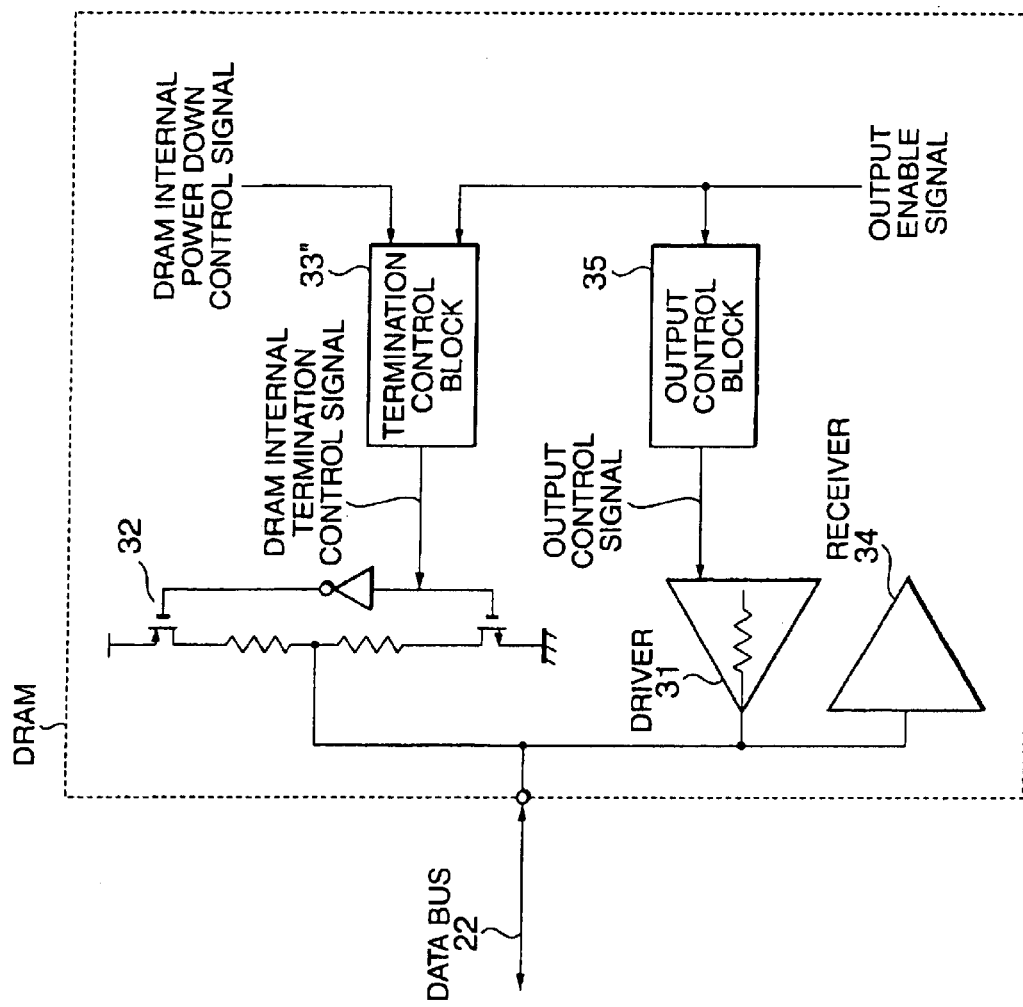
FIG. 13 is a block diagram of another example of the DRAM adapted to execute the termination control operation illustrated in FIG. 11.

Referring to FIG. 13, the DRAM has another structure implementing the operation illustrated in FIG. 10. This structure is different from the structure of FIG. 12 in that no termination control signal is supplied from the memory controller. This structure can be used in case where the active termination circuit 32 need not forcedly be invalidated. As compared with FIG. 12, no termination control signal terminal is required so that the device and the system can be simplified.

Specifically, a termination control block 33'' supplies the internal termination control signal of a L level to the active termination circuit 32 to put the active termination circuit 32 in an invalid state in response to the internal power down control signal and the output enable signal.

In the foregoing embodiments, the power-supply voltages of the DRAM and the termination circuit are identical with each other. However, different power-supply voltages may be used. In the foregoing, the DRAM's are identical in structure. However, use may be made of a combination of DRAM's different in structure. Thus, this invention can be modified in various other manners within the scope of this invention.

As described above, in the memory system comprising the memory controller and the memory devices connected through the data bus to the memory controller, the memory devices are provided with the active termination circuits selectively operable while the memory controller is provided with the termination circuit. It is therefore possible according to this invention to transfer the data through the data bus at a high speed without the influence of reflection or the like. By the use of the power down control signal used in the power down mode, power consumption can considerably be reduced.

What is claimed is:

1. A memory device which is connected to a data bus and which comprises:
   an active termination circuit for terminating said memory device when said active termination circuit is electrically put into an active state and for unterminating said memory device when said active termination circuit is electrically put into an inactive state; and
   a control circuit for controlling said active termination circuit to electrically put said active termination circuit into said active state or said inactive state, wherein said control circuit is responsive to a data output enable signal produced in said memory device and a termination control signal which is supplied from the outside of said memory device for putting said active termination circuit into said active state or said inactive state, said control circuit producing an internal termination control signal from said data output enable signal and said termination control signal.

2. A memory device as claimed in claim 1, wherein said control circuit comprises:
   a receiver supplied with said termination control signal and a clock signal for receiving said termination control signal in synchronism with said clock signal; and
   a termination control section for producing said internal termination control signal in response to said data output enable signal and said termination control signal received by said receiver.

3. A memory device as claimed in claim 1, wherein said control circuit comprises;
   a receiver for receiving said termination control signal in asynchronism with a clock signal; and
   a termination control section for producing said internal termination control signal in response to said data output enable signal and said termination control signal received by said receiver.

4. A memory device as claimed in claim 1, wherein said active termination circuit comprises a pair of transistors different in channel type from each other and a resistor circuit connected in series between said transistors, one of said transistors having a gate supplied with said internal termination control signal, a remaining one of said transistors having a gate supplied with an inverted signal of said internal termination control signal, said active termination circuit being electrically put into said active state by turning said transistors on, said active termination circuit being electrically put into said inactive state by turning said transistors off.

5. A memory device as claimed in claim 4, wherein said resistor circuit comprises two resistors connected in series and equal in resistance, a common connecting point of said two resistors being connected to said data bus.

6. A memory device as claimed in claim 4, wherein a power-supply voltage of said active termination circuit is common to that of said memory device.

7. A memory device which is connected to a data bus and which comprises:
   an active termination circuit for terminating said memory device when said active termination circuit is electrically put into an active state and for unterminating said memory device when said active termination circuit is electrically put into an inactive state; and
   a control circuit for controlling said active termination circuit to electrically put said active termination circuit into said active state or said inactive state, wherein said control circuit is responsive to a data output enable signal, a termination control signal, and a power down signal, said output enable signal and said power down signal being produced in said memory device, said termination control signal being supplied from the outside of said memory device for putting said active termination circuit into said active state or said inactive state, said control circuit producing an internal termination control signal from said data output enable signal, said power down signal, and said termination control signal.

8. A memory device as claimed in claim 7, wherein said control circuit comprises:
   a receiver for receiving said termination control signal; and
   a termination control section for producing said internal termination control signal in response to said data output enable signal, said power down signal, and said termination control signal received by said receiver.

9. A memory device as claimed in claim 7, wherein said active termination circuit comprises a pair of transistors different in channel type from each other and a resistor circuit connected in series between said transistors, one of said transistors having a gate supplied with said internal termination control signal, a remaining one of said transistors having a gate supplied with an inverted signal of said internal termination control signal, said active termination circuit being electrically put into said active state by turning said transistors on, said active termination circuit being electrically put into said inactive state by turning said transistors off.

10. A memory device as claimed in claim 9, wherein said resistor circuit comprises two resistors connected in series and equal in resistance, a common connecting point of said two resistors being connected to said data bus.

11. A memory device as claimed in claim 9, wherein a power-supply voltage of said active termination circuit is common to that of said memory device.

12. A memory device which is connected to a data bus and which comprises:

an active termination circuit for terminating said memory device when said active termination circuit is electrically put into an active state and for unterminating said memory device when said active termination circuit is electrically put into an inactive state; and a control circuit for controlling said active termination circuit to electrically put said active termination circuit into said active state or said inactive state, wherein said control circuit comprises a termination control section for producing an internal termination control signal only from a data output enable signal and a power down signal which are produced in said memory device.

13. A memory device as claimed in claim 12, wherein said active termination circuit comprises a pair of transistors different in channel type from each other and a resistor circuit connected in series between said transistors, one of said transistors having a gate supplied with said internal termination control signal, a remaining one of said transistors having a gate supplied with an inverted signal of said internal termination control signal, said active termination circuit being electrically put into said active state by turning said transistors on, said active termination circuit being electrically put into said inactive state by turning said transistors off.

14. A memory device as claimed in claim 13, wherein said resistor circuit comprises two resistors connected in series and equal in resistance, a common connecting point of said two resistors being connected to said data bus.

15. A memory device as claimed in claim 13, wherein a power-supply voltage of said active termination circuit is common to that of said memory device.

16. A memory system comprising a plurality of memory devices connected to a single data bus, wherein each of said memory devices comprises:

a control circuit for producing an internal termination control signal for indicating an inactive state when data are delivered to said data bus and when a termination control signal is received from the outside of each of said memory devices through said data bus; and an active termination circuit to be kept in said inactive state when said internal termination control signal indicates said inactive state, wherein each of said memory devices is operable in synchronism with a clock signal and acquires said termination control signal in asynchronism with said clock signal.

17. A memory system comprising a plurality of memory devices connected to a single data bus, wherein each of said memory devices comprises:

a control circuit for producing an internal termination control signal for indicating an inactive state when data are delivered to said data bus and when a termination control signal is received from the outside of each of said memory devices through said data bus; and an active termination circuit to be kept in said inactive state when said internal termination control signal indicates said inactive state, wherein said control circuit of each of said memory devices produces said internal termination control signal indicating said inactive state when each of said memory devices is put in a power down state, said active termination circuit being put in said inactive state in response to said internal termination control signal.

* * * * *